(12) United States Patent
You et al.

(10) Patent No.: US 10,950,732 B2
(45) Date of Patent: Mar. 16, 2021

(54) SEMICONDUCTOR DEVICE AND METHOD OF MANUFACTURING THE SAME

(71) Applicant: TAIWAN SEMICONDUCTOR MANUFACTURING COMPANY, LTD., Hsinchu (TW)

(72) Inventors: Jia-Chuan You, Taoyuan County (TW); Chia-Hao Chang, Hsinchu (TW); Yu-Ming Lin, Hsinchu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/235,610

(22) Filed: Dec. 28, 2018

(65) Prior Publication Data
US 2020/0098922 A1  Mar. 26, 2020

Related U.S. Application Data

(60) Provisional application No. 62/734,567, filed on Sep. 21, 2018.

(51) Int. Cl.
| H01L 29/78 | (2006.01) |
| H01L 29/66 | (2006.01) |
| H01L 29/49 | (2006.01) |
| H01L 21/28 | (2006.01) |
| H01L 21/321 | (2006.01) |
| H01L 21/768 | (2006.01) |
| H01L 29/417 | (2006.01) |
| H01L 29/51 | (2006.01) |

(52) U.S. Cl.
CPC .... *H01L 29/7851* (2013.01); *H01L 21/28088* (2013.01); *H01L 21/3212* (2013.01); *H01L 21/76829* (2013.01); *H01L 29/41791* (2013.01); *H01L 29/4966* (2013.01); *H01L 29/6656* (2013.01); *H01L 29/6681* (2013.01); *H01L 29/66545* (2013.01); *H01L 29/511* (2013.01)

(58) Field of Classification Search
CPC .......... H01L 21/76897; H01L 23/5226; H01L 21/76834; H01L 21/76843; H01L 21/823475; H01L 29/66545
USPC ................................. 257/368; 438/197, 269
See application file for complete search history.

(56) References Cited

U.S. PATENT DOCUMENTS

| 9,548,366 B1 * | 1/2017 | Ho ....................... H01L 29/6656 |
| 2015/0235948 A1 * | 8/2015 | Song ................... H01L 23/5283 |
| | | 257/368 |

\* cited by examiner

*Primary Examiner* — Jonathan Han
(74) *Attorney, Agent, or Firm* — Maschoff Brennan

(57) ABSTRACT

A semiconductor device and method of forming the same are provided. The semiconductor device includes a gate structure formed over a substrate. A spacer layer is formed on side portions of the gate structure. A first dielectric layer is formed over the gate structure. A conductive cap layer passes through the first dielectric layer and is formed over the gate structure. A top surface of the conductive cap layer is above a top surface of the spacer layer. The semiconductor device further includes a conductive layer formed over the conductive cap layer. The conductive layer is electrically coupled with the conductive cap layer.

20 Claims, 11 Drawing Sheets

SEMICONDUCTOR DEVICE AND METHOD OF MANUFACTURING THE SAME

PRIORITY CLAIM AND CROSS-REFERENCE

This application claims priority to U.S. Provisional Application Ser. No. 62/734,567, filed on Sep. 21, 2018, which is incorporated by reference herein in its entirety.

BACKGROUND

Over the past several decades, the semiconductor integrated circuit (IC) industry has experienced rapid growth. The semiconductor integrated circuit (IC) is basically an assembly of semiconductor electronic components, fabricated as a single unit, in which miniaturized active devices (such as transistors and diodes) and passive devices (for example, capacitors and resistors) and their interconnections are built up on a thin substrate of semiconductor material (such as silicon). Technological advances in IC design and material have produced generations of ICs where each generation has smaller and more complex circuits than previous generations.

The process flow for semiconductor fabrication of integrated circuits (ICs) may include front-end-of-line (FEOL), middle-of-line (MOL), and back-end-of-line (BEOL) processes. The FEOL process may include one or more of wafer preparation, isolation, well formation, gate patterning, spacer, extension and source/drain implementation, silicide formation, and dual stress liner formation. The MOL process may include gate and terminal contact formation. The BEOL processes may include a series of wafer processing steps for interconnecting the semiconductor devices created during the FEOL and MOL process.

BRIEF DESCRIPTION OF THE DRAWINGS

Aspects of the present disclosure are best understood from the following detailed description when read with the accompanying figures. It is noted that various features are not drawn to scale. In fact, the dimensions of the various features may be increased or reduced for clarity of discussion.

DETAILED DESCRIPTION

Figure 1:
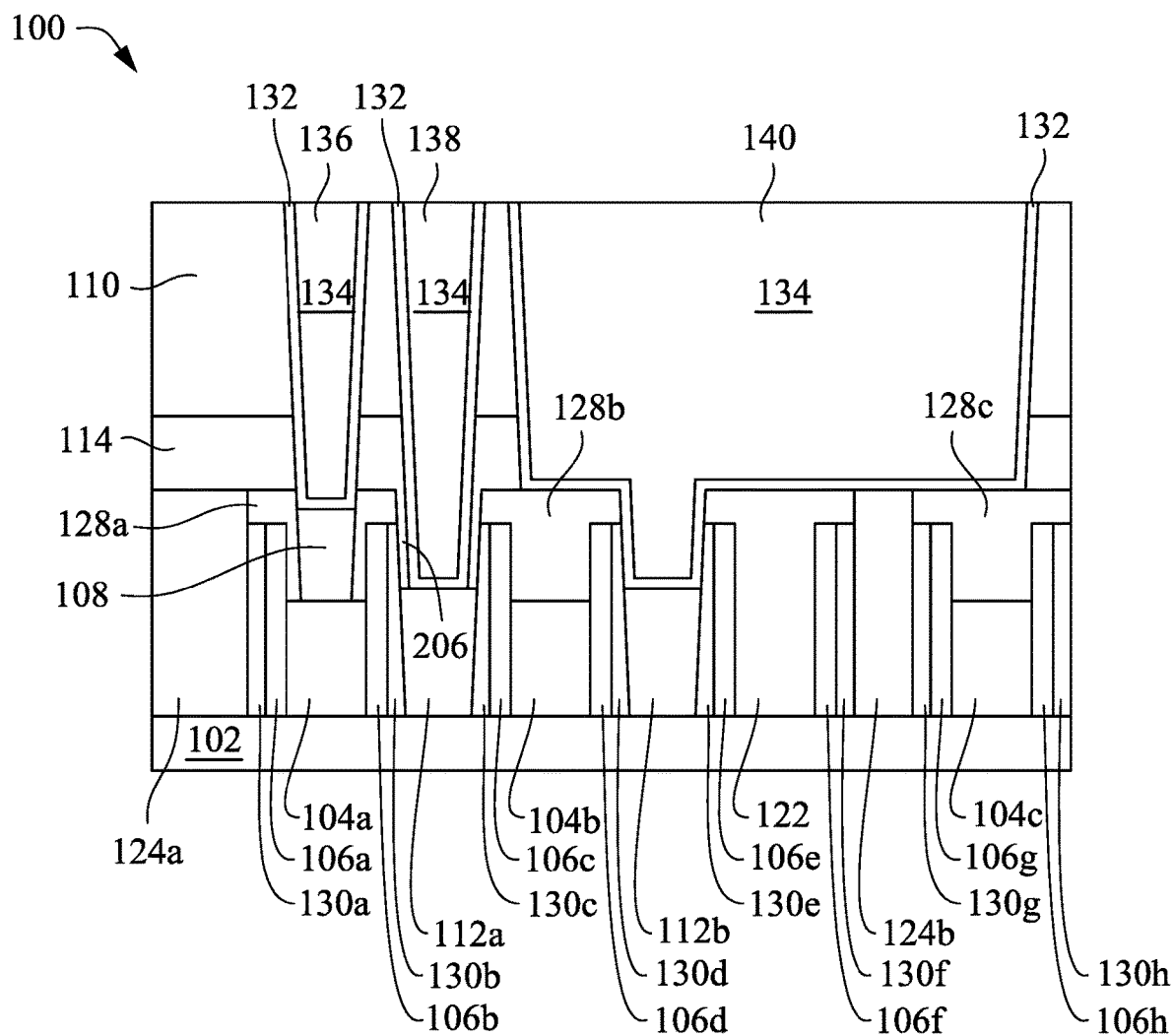
FIG. 1 is a cross-sectional view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device and the method of forming the same are provided in accordance with some embodiments. The semiconductor device can be a Fin Field-Effect Transistor (FinFET) device, a complementary metal-oxide-semiconductor (CMOS) device, a silicon-on-insulator (SOI) device, a Metal-Oxide-Semiconductor Field-Effect (MOSFET) device, or the like. The intermediate stages of forming the semiconductor device are illustrated. The variations of some embodiments are discussed. Throughout the various views and illustrative embodiments, like reference numbers are used to designate like elements.

As semiconductor devices scale down to advanced technology node, such as 10 nm node and beyond, the complexity of IC processing and manufacturing is increased and the related process window is reduced. Embodiments described herein provide for a metal layer to protect spacer layers and avoid gate height reduction during contact formation for advanced technology node.

Aspects of the disclosure provide a semiconductor device incorporating a metal cap layer over a gate structure. The gate structure can be a high-K/metal gate stack including multiple layers, a polysilicon gate connected with a metal electrode in a MOSFET device, or the like. Because of the presence of the metal cap layer, the gate structure can be protected during the subsequent manufacturing process steps, such as an etching process. Consequently, gate height loss due to the subsequent etching process is prevented. In addition, spacer layers between the gate structure and an adjacent source/drain structure are protected by the metal cap layer during the subsequent manufacturing process steps, and an electrical short between the gate structure and the adjacent source/drain structure are also prevented.

FIG. 1 is a cross-sectional view of a semiconductor device 100 in accordance with some embodiments of the present disclosure. The semiconductor device 100 includes a substrate 102. The substrate 102 could include silicon (Si), silicon germanium (SiGe), silicon phosphorous (SiP), silicon carbide (SiC), or the like, or the combination thereof, for example. The substrate can be a portion of a fin structure (silicon based) in a Fin Field-Effect Transistor (FinFet) and can include a Si Fin, a shallow trench isolation (STI) region, and epitaxially grown SiGe source/drain structures.

The semiconductor device 100 may also include a plurality of gate structures 104. For example, three gate structures 104a-104c are illustrated in FIG. 1. The gate structures 104 can be applied in P-channel Field-Effect devices, N-channel Field-Effect devices, or both based on the design requirements. Each gate structure 104 may include a single-layer or multi-layer configurations, including one or more of interfacial layer, a High-K layer, a work function layer, a blocking layer, an adhesion layer, and a metal filling layer. The gate structures 104 may be made of Ti, Ag, Al, HfO, AlTiC, AlTiO, AlTiN, AlTiC, AlTiO, TiAlN, TaC, TaCN, TaSiN, Mn, Zr, TiN, TaN, Ru, Mo, Al, WN, Cu, W, or any suitable materials. The gate structures 104 may be formed by performing one or more of atomic layer deposition (ALD), physical vapor deposition (PVD), chemical vapor deposition (CVD), or other suitable process.

A metal cap layer 108 may be deposited on top of the gate structures 104. As shown in FIG. 1, the metal cap layer 108 is formed over a gate structure 104a. The metal cap layer 108 may include tungsten (W), titanium (Ti), titanium nitride (TiN), combinations thereof, or other suitable conductive materials. The metal cap layer 108 has a thickness in a range from about 2 nm to 100 nm. A top surface of the metal cap layer 108 can be formed above top surfaces of spacer layers 106a-106b and 130a-130b. In one embodiment, the top surface of the metal cap layer 108 may be approximately higher than the top surfaces of the spacer layers 106a-106b and 130a-130b by about 1 nm or more.

The semiconductor device 100 may also include a cut metal gate (CMG) layer 122. The CMG layer 122 can be a dummy gate structure based on design requirements. The CMG layer 122 can be made of a dielectric material, and provide necessary electrical isolation in the semiconductor device 100. The CMG layer 122 can include SiO, SiN, SiC, SiON, SiOC, SiCN, amorphous silicon, or other suitable materials. The CMG layer 122 can be formed by atomic layer deposition (ALD), physical vapor deposition (PVD), chemical vapor deposition (CVD), or other suitable process.

The semiconductor device 100 can include one or more cut metal dielectric (CMD) layers 124. For example, two CMD layers 124a-124b are included in the semiconductor device 100 as shown in FIG. 1. The CMD layers 124 can be dummy drain/source electrodes based on design requirements. The CMD layers 124 can provide necessary electrical isolation in the semiconductor device 100. The CMD layers 124 can include SiO, SiN, amorphous silicon, or other suitable materials.

The semiconductor device 100 may also include a plurality of helmet layers 128. For example, three helmet layers 128a-128c are included in the semiconductor device 100 as shown in FIG. 1. In some embodiments, the helmet layers 128 are self-aligned dielectric layers formed over the gate structures 104. As shown in FIG. 1, the helmet layer 128a is formed over the gate structure 104a, the helmet layer 128b is formed over the gate structure 104b, and the helmet layer 128c is formed over the gate structure 104c. The helmet layers 128 can be configured to protect the gate structures 104 during subsequent processing steps. The helmet layers 128 can also serve as sacrificial layers for forming self-aligned contacts, such as the subsequently formed gate contacts (e.g., a gate contact 136). The helmet layers 128 can include SiN, SiO, SiC, SiON, SiOC, SiCN, SiOCN, AlO, AlON, ZrO, ZrN, amorphous silicon, or other suitable material. The helmet layers 128 can have a thickness between 5 nm and 200 nm. It should be noted that the helmet layer 128a is patterned to expose the gate structure 104a based on design requirement.

The semiconductor device 100 further includes a plurality of metal drain (MD) layers 112. For example, two MD layers 112a-112b are included in the semiconductor device 100 as shown in FIG. 1. The MD layers 112 can be metal electrodes electrically coupled with source/drain structures. In an embodiment, the 112a is electrically coupled with a source structure and the 112b is electrically coupled with a drain structure. In another embodiment, the 112a is electrically coupled with a drain structure and the 112b is electrically coupled with a source structure. In yet another embodiment, both MD layers 112a-112b can be electrically coupled with source structures or drain structures depending on the design requirements. The MD layers 112 can include cobalt (Co), ruthenium (Ru), tungsten (W), or other suitable conductive material. The thickness of the MD layer 112 can be in a range from 5 nm to 200 nm. In an embodiment illustrated in FIG. 1, the MD layer 112a is a source electrode and the MD layer 112b is a drain electrode.

The semiconductor device 100 may also include a plurality of spacer layers 106 and 130. For example, eight spacer layers 106a-106h and eight spacer layers 130a-130h are included in semiconductor device 100. The spacer layers 106 may include low-k material with a thickness in a range from 1 nm to 30 nm. The low-k material can be a carbon containing material or a carbon/oxygen containing material. The spacer layers 106 can include SiOCN, SiOC, SiCOH, or other suitable materials. The spacer layers 130 may be nitride layers with a thickness in a range from 1 nm to 30 nm. The spacer layers 130 can include SiN, SiCN, SiON, SiOCN, or other suitable materials. The spacer layers 106 and 130 may be formed along the side portions of the gate structures (i.e., metal gates) 104, the MD layers (i.e., source/drain electrodes) 112, the CMG layer (i.e., dummy gate structure) 122 and the CMD layers (i.e., dummy source/drain electrodes) 124. In some embodiments, the spacer layers 106 and 130 are configured to prevent a short circuit between the gate structure and the adjacent source/drain electrodes. The spacer layers 106 and 130 can also reduce overlap capacitance between the gate structure and the source/drain electrodes.

The semiconductor device 100 may also include a contact etch stop layer (CESL) 114 formed over the helmet layers 128, and an interlayer dielectric (ILD) layer 110 formed over the CESL layer 114. The ILD layer 110 may be made of silicon nitride (SiN), silicon oxide (SiO), silicon oxynitride (SiNO), silicon carbide (SiC), silicon oxycarbide (SiOC), silicon carbonitride (SiCN), aluminum oxide (AlO), aluminum oxynitride (AlON), zirconium oxide (ZrO), zirconium nitride (ZrN), amorphous silicon (A—Si), or other suitable materials. The ILD layer 110 has a thickness in the range from about 5 nm to 500 nm. The contact etch stop layer (CESL) 114 may be made of silicon nitride (SiN), silicon oxide (SiO), silicon oxynitride (SiNO), silicon carbide (SiC), silicon oxycarbide (SiOC), silicon carbonitride (SiCN), aluminum oxide (AlO), aluminum oxynitride (AlON), zirconium oxide (ZrO), zirconium nitride (ZrN), amorphous silicon (A—Si), or other suitable materials. The contact etch stop layer (CESL) 114 has a thickness in the range of about 1 nm to 200 nm.

The semiconductor device 100 can include a self-aligned dielectric layer 206. The self-aligned dielectric layer can be formed over the source electrode 112a. A top surface of the self-aligned dielectric layer 206 is level with a top surface of the helmet layers 128. The self-aligned dielectric layer 206 can include silicon nitride (SiN), silicon oxide (SiO), silicon oxynitride (SiNO), silicon carbide (SiC), silicon oxycarbide (SiOC), silicon carbonitride (SiCN), aluminum oxide (AlO), aluminum oxynitride (AlON), zirconium oxide (ZrO), zirconium nitride (ZrN), amorphous silicon (A—Si), or other suitable materials. The self-aligned dielectric layer 206 has a thickness in the range from about 5 nm to about 200 nm. In some embodiments, the self-aligned dielectric layer 206 can be configured to protect the source/drain electrode 112a. The self-aligned dielectric layer 206 can also serve as a sacrificial layer for forming self-aligned contacts, such as the subsequently formed source/drain contacts (e.g., source/drain contacts 138 and 140). As shown in FIG. 1, the self-aligned dielectric layer 206 is patterned to expose the source electrode 112a based on design requirement. In some embodiments, the self-aligned dielectric layer and the CESL layer are made of a same material and formed in a single processing step.

A plurality of contact structures are formed in the semiconductor device 100. For example, a first contact structure 136 is formed in the ILD layer 110, the CESL layer 114, and the helmet layer 128a. In some embodiments, the first contact structure 136 serves as a gate contact to be electrically coupled with the gate structure 104a. The first contact structure 136 has side portions and a bottom portion. The metal cap layer 108 is formed over the bottom portion of the first contact structure 136 and in direct contact with the gate structure 104a. A conductive barrier layer 132 is formed over the metal cap layer 108 and along the side portions of the first contact structure 136. The conductive barrier layer 132 can include Ta, Ti, TiN, TaN, or the like, with a thickness, for example, between 5 Å and 20 nm. A conductive layer 134 is formed over the conductive barrier layer 132 in the first contact structure 136. The conductive layer 134 can include tungsten (W), cobalt (Co), ruthenium (Ru), copper (Cu), or any other suitable material.

Still referring to FIG. 1, the semiconductor device 100 includes a second contact structure 138 that is formed in the ILD layer 110, the CESL layer 114, and the self-aligned dielectric layer 206. The second contact structure 138 can function as a source contact to be electrically coupled with the source electrode 112a. The second contact structure 138 has side portions and a bottom portion that is in direct contact with the source electrode 112a. The conductive barrier layer 132 is formed over the source electrode 112a and along the side portions of the second contact structure 138. The conductive layer 134 is formed over the conductive barrier layer 132 in the second contact structure 138.

A third contact structure 140 is formed in the ILD layer 110 and the CESL layer 114. The third contact structure 140 serves as a drain contact to be electrically coupled with the drain electrode 112b. The third contact structure 140 has side portions and a bottom portion that is in direct contact with the drain electrode 112b. The conductive barrier layer 132 is formed over the drain electrode 112b and along the side portions of the third contact structure 140. The conductive layer 134 is formed over the conductive barrier layer 132 in the third contact structure 140.

During the formation of the contact structures, corresponding contact regions (contact openings) are formed by performing an etching process. Without proper protective measures, the gate structures 104 and the spacer layers 106 and 130 could be damaged. As a result, the gate height of the gate structures, such as 104a, may be reduced. Further, without the proper protective measures, an electrical short between the gate structure and the adjacent source/drain electrodes may happen when the spacer layers are damaged due to the small spacing. As semiconductor devices continue to shrink, maintaining isolation requirement become increasingly more difficult. It has been observed that the spacer protection described herein may be scaled down for advance technology node while still satisfying isolation requirement. In some embodiments, the metal cap layer 108 protects the spacer layers 106a-106b and 130a-130b during etching process. The metal cap layer 108 can also protect the gate structure 104a and reduces the gate height loss due to the etching process. By forming the metal cap layer 108 over the gate structure 104a, the damage, such as material loss and electrical short, can be minimized.

Figure 2:
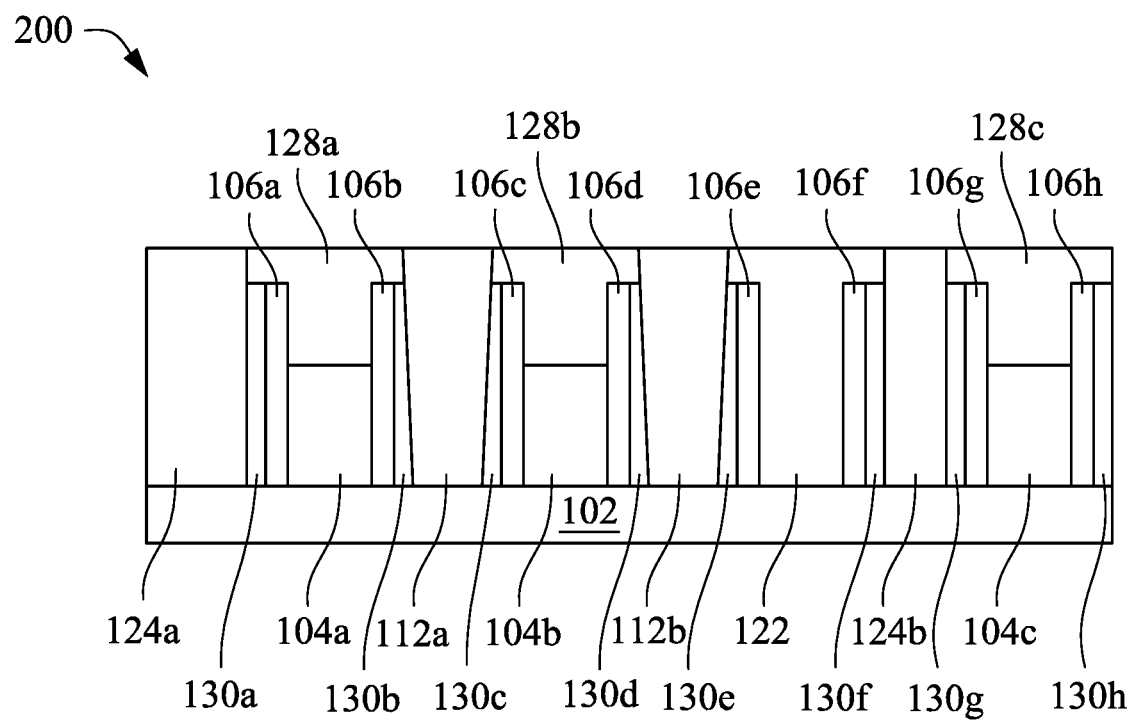
FIGS. 2 through 10 are cross-sectional views of various intermediary steps of manufacturing a semiconductor device in accordance with some embodiments.

FIGS. 2 through 10 are cross-sectional views of various intermediary steps of manufacturing a semiconductor device 100. As shown in FIG. 2, a semiconductor structure 200 is prepared through a variety of semiconductor processing techniques, such as photolithography, chemical vapor deposition (CVD), physical vapor deposition (PVD), dry etching, wet etching, wet clean, diffusion, atomic layer deposition (ALD), chemical mechanical planarization (CMP), ion implantation, metrology, or other suitable techniques. The semiconductor structure 200 has a substrate 102. The substrate 102 can include silicon (Si), silicon germanium (SiGe), silicon phosphorous (SiP), silicon carbide (SiC), or the like, or the combination thereof, for example. The substrate 102 can be a portion of a fin structure (silicon based) in a Fin Field-Effect Transistor (FinFet) and can include one or more of a Si Fin, a STI region, and epitaxially grown SiGe source/drain structures. Over the substrate 102, a plurality of gate structures 104a-104c is formed. Each gate structure can include a single-layer or multi-layer configurations including one or more of an interfacial layer, a High-K layer, a work function layer, a blocking layer, an adhesion layer, and a metal filling layer.

As shown in FIG. 2, one or more source/drain electrodes 112 are formed over the substrate 102. In an embodiment, the 112a is a source electrode and the 112b is a drain electrode. The source/drain electrodes 112 can be made of cobalt (Co), ruthenium (Ru), tungsten (W), or other suitable conductive materials. The source/drain electrodes 112 can also include an adhesion layer (not shown) formed over the substrate 102 and along the spacer layers 130. The adhesion layer can include Ti, TiN, Ta, TaN, or the like. The source/drain electrodes 112 can have a thickness in a range from 5 nm to 200 nm. The source/drain electrodes 112 can be formed by performing one or more of chemical vapor deposition (CVD), physical vapor deposition (PVD), atomic layer deposition (ALD), sputtering, e-beam evaporation, or any combination thereof. For example, a metal layer of Co can be deposited through a CVD process at a temperate between 50° C. and 600° C., and at pressure of 1 Torr to 100 Torr. When the metal layer is formed, a subsequent CMP process can be applied to remove any excessive metal layer (e.g., Co, Ru, or W).

The semiconductor structure 200 includes one or more dummy source/drain electrodes 124 based on design requirements. The dummy source/drain electrodes 124 can include SiO, SiN, amorphous silicon, or other suitable materials. The semiconductor structure 200 also includes one or more dummy gate structures 122 depending on the design requirements. The dummy gate structure 122 can include SiO, SiN, SiC, SiON, SiOC, SiCN, amorphous silicon, or other suitable materials. Both the dummy gate structure 122 and the dummy source/drain electrodes 124 can be formed by performing one or more of atomic layer deposition (ALD), physical vapor deposition (PVD), chemical vapor deposition (CVD), or other suitable process.

A plurality of spacer layers 106 and 130 are formed along the side portions of the gate structures 104, the dummy gate structure 122, the source/drain electrodes 112, and the dummy source/drain electrodes 124. The spacer layers 106 may include low-k material with a thickness in a range from 1 nm to 30 nm. The low-k material can be a carbon containing material or a carbon/oxygen containing material. The spacer layers 106 can include SiOCN, SiOC, SiCOH, or other suitable materials. The spacer layers 130 may be nitride layers with a thickness in a range from 1 nm to 30 nm. The spacer layers 130 can include SiN, SiCN, SiON, SiOCN, or other suitable materials. In some embodiments, the spacer layers 106 and 130 are configured to prevent a short circuit between the gate structure and the adjacent source/drain electrodes. The spacer layers 106 and 130 can also reduce overlap capacitance between the gate structure and the adjacent source/drain electrodes. The spacer layers can be formed by performing one or more of vapor deposition (CVD), physical vapor deposition (PVD), atomic layer deposition (ALD), diffusion, or any combination thereof. For example, the SiOC can be formed by a CVD process at a temperature between 50° C. and 600° C., and at a pressure between 1 Torr and 100 Torr.

The semiconductor structure 200 may also include a plurality of helmet layers 128. The helmet layers 128 are self-aligned dielectric layers formed over the gate structures 104. As shown in FIG. 2, the helmet layer 128a is formed over the gate structure 104a, the helmet layer 128b is formed over the gate structure 104b, and the helmet layer 128c is formed over the gate structure 104c. In some embodiments, the helmet layers 128 can be configured to protect the gate structures 104. The helmet layers 128 can also serve as sacrificial layers when subsequent gate contacts (e.g., a gate contact 136 shown in FIG. 1) are formed. The helmet layers 128 can have a thickness in a range from 5 nm to 200 nm. The helmet layers 128 can include SiN, SiO, SiC, SiON, SiOC, SiCN, SiOCN, AlO, AlON, ZrO, ZrN, amorphous silicon, or other suitable materials. Any suitable deposition process can be applied to form the helmet layers 128, such as chemical vapor deposition (CVD), physical vapor deposition (PVD), atomic layer deposition (ALD), sputtering, e-beam evaporation, or any combination thereof. For example, the SiO can be formed by performing a CVD process with precursor $SiH_4/N_2O$ at a temperature between 50° C. and 600° C., and at a pressure between 1 Torr and 100 Torr.

Figure 3:
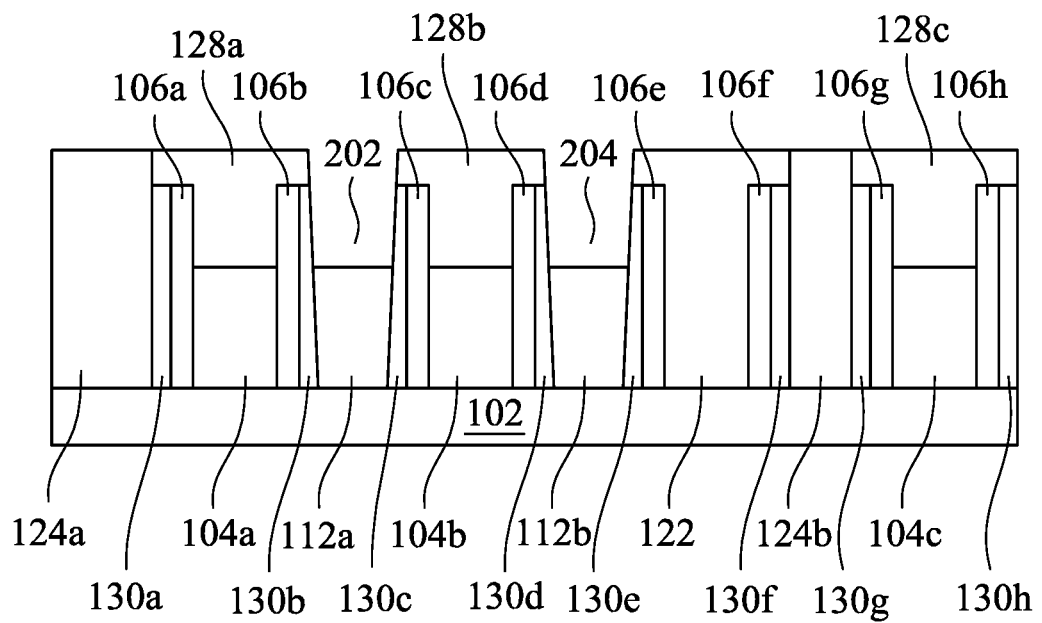

In FIG. 3, the source/drain electrodes 112 can be recessed to form openings 202 and 204. Any suitable method can be used to recess the source/drain electrodes 112. For example, a selective blank etching can be applied to recess the source/drain electrodes 112. In the selective blank etching, selective wet chemical or selective dry etching plasma can be applied to preferably remove the source/drain electrodes over other structures, such as the helmet layers 128, the dummy source/drain electrodes 124 and the dummy gate structure 122. In another example, a patterned photoresist can be formed over the semiconductor structure 200 to expose the source/drain electrodes 112 and cover the other structures. The photoresist can be patterned according to any suitable technique, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like. When the patterned photoresist is formed, an etching process, such as a wet etching or a dry etching, can be applied. The etching process can remove a portion of the source/drain electrodes 112 to form the openings 202 and 204. The other structures are protected by the photoresist during the etching process. A subsequent plasma ashing and a wet clean can be applied to remove the remaining photoresist.

Figure 4:
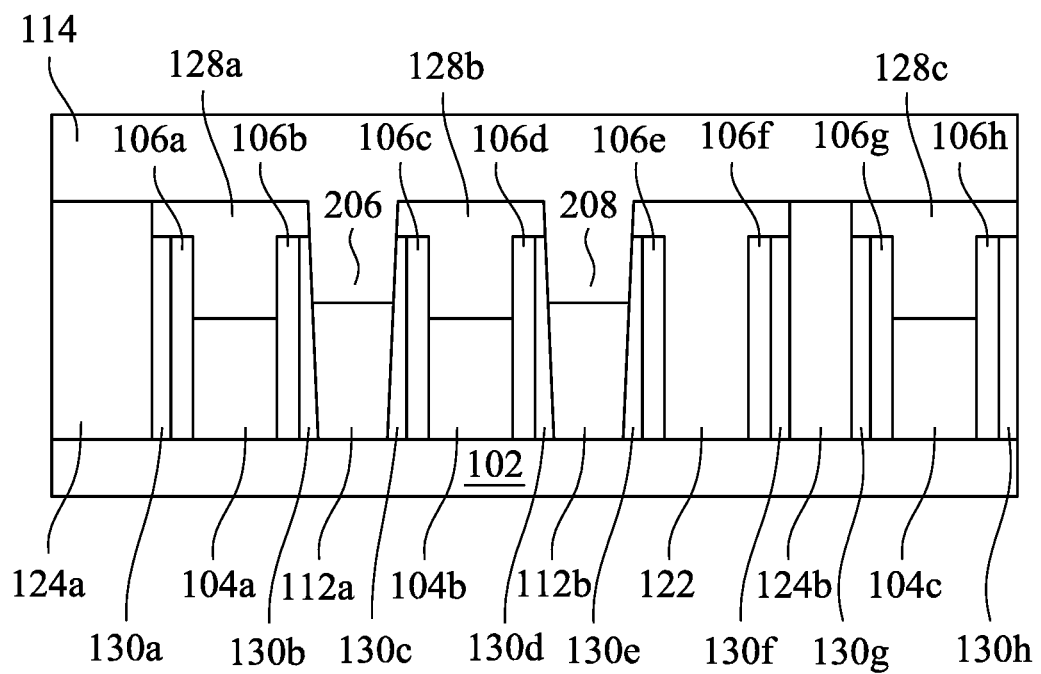

In FIG. 4, the self-aligned dielectric layers 206 and 208 are formed to fill the openings 202 and 204. The self-aligned dielectric layer 206 can include silicon nitride (SiN), silicon oxide (SiO), silicon oxynitride (SiON), silicon carbide (SiC), silicon oxycarbide (SiOC), silicon carbonitride (SiCN), aluminum oxide (AlO), aluminum oxynitride (AlON), zirconium oxide (ZrO), zirconium nitride (ZrN), amorphous silicon (A—Si), or other suitable materials. The self-aligned dielectric layer 206 has a thickness in a range from 5 nm to 200 nm. In some embodiments, the self-aligned dielectric layers 206 and 208 can be configured to protect the source/drain electrodes 112. The self-aligned dielectric layers 206 and 208 can also serve as sacrificial layers for forming self-aligned contacts, such as the subsequently formed source/drain contacts (e.g., the source/drain contacts 138 and 140). Any suitable deposition process can be applied to form the self-aligned dielectric layers, such as chemical vapor deposition (CVD), physical vapor deposition (PVD), atomic layer deposition (ALD), diffusion, or any combination thereof. For example, the SiON can be formed by performing a CVD process with precursor of $SiH_4/N_2O$ at a temperature between 50° C. and 600° C., and a pressure between 1 Torr and 100 Torr. In some embodiments, a subsequent CMP process can be applied to remove any excessive self-aligned dielectric layers. As a result of the planarization process, the top surface of the self-aligned dielectric layers 206 and 208 is level with the top surfaces of the adjacent helmet layers 128. In an embodiment of FIG. 4, the self-aligned dielectric layers 206 and 208 are made of SiN.

Still referring to FIG. 4, over the self-aligned dielectric layers, the contact etch stop layer (CESL) 114 is formed. In some examples, the CESL 114 includes silicon nitride (SiN), silicon oxide (SiO), silicon oxynitride layer (SiNO), silicon carbide (SiC), silicon oxycarbide (SiOC), silicon carbonitride (SiCN), aluminum oxide (AlO), aluminum oxynitride (AlON), zirconium oxide (ZrO), zirconium nitride (ZrN), amorphous silicon (A—Si), or other suitable materials. The contact etch stop layer (CESL) 114 may be formed by performing plasma-enhanced chemical vapor deposition (PECVD) process and/or other suitable deposition or oxidation process. The contact etch stop layer 114 may have a thickness in a range between about 1 nm and about 200 nm. In an embodiment of FIG. 4, the CESL 114 is made of SiN. In some embodiments, a subsequent surface planarization process (e.g., CMP) can be applied to remove any excessive CESL layer.

Still refereeing to FIG. 4, in another embodiment, the self-aligned dielectric layers 206 and 208 and the CESL layer 114 are made of a same material and formed in a single processing step. For example, a dielectric material, such as SiN, can be deposited by performing a CVD process to fill in the openings 202 and 204. The SiN deposition can be performed further to cover the top surfaces of the helmet layers 128, the top surfaces of the dummy source/drain electrodes 124, and the top surface of the dummy gate 122 with a certain thickness, such as a thickness in a range from 5 nm to 500 nm. As a result of the SiN deposition, the openings 202 and 204 can be filled fully. In addition, the top surface of the helmet layers 128, the top surfaces of the dummy source/drain electrodes 124, and the top surface of the dummy gate 122 can be covered. A subsequent surface planarization process (e.g., CMP) can be applied to remove any excessive SiN layer thereafter. When the surface planarization is completed, the SiN deposited in the recessed portion of the source/drain electrodes (e.g., openings 202 and 204) forms the self-aligned dielectric layers (e.g., 206 and 208 in FIG. 4), and the SiN deposited over the top surfaces of the helmet layers 128, the top surfaces of the dummy source/drain electrodes 124, and the top surface of the dummy gate 122 forms the CESL layer 114.

Figure 5:
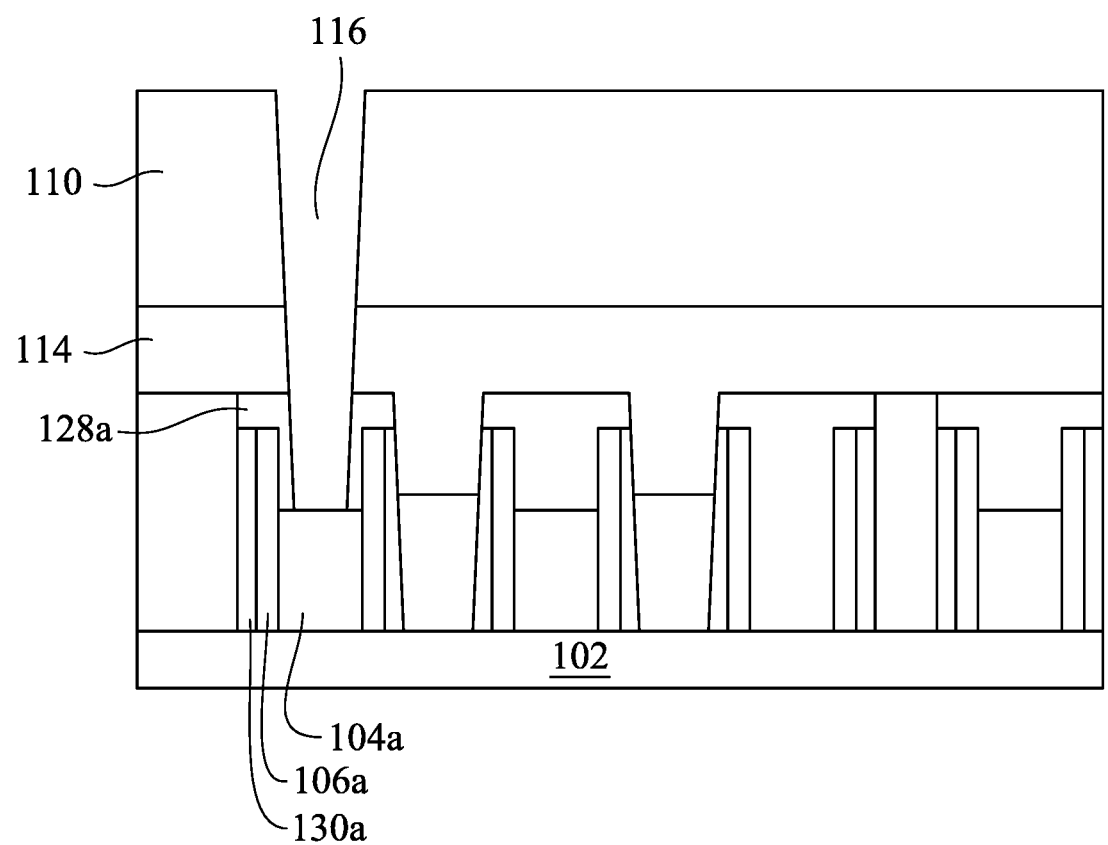

In FIG. 5, the interlayer dielectric (ILD) layer 110 can be deposited over the contact etch stop layer 114. The interlayer dielectric (ILD) layer 110 includes material such as silicon nitride (SiN), silicon oxide (SiO), silicon oxynitride (SiNO), silicon carbide (SiC), silicon oxycarbide (SiOC), silicon carbonitride (SiCN), aluminum oxide (AlO), aluminum oxynitride (AlON), zirconium oxide (ZrO), zirconium nitride (ZrN), amorphous silicon (A—Si), or other suitable materials. The interlayer dielectric (ILD) layer 110 may be deposited by performing a CVD process or other suitable deposition technique. In some embodiments, after formation of the interlayer dielectric (ILD) layer 110, the semiconductor structure 100 may be subject to an anneal process, for example, to anneal the interlayer dielectric (ILD) layer 110. The inter layer dielectric (ILD) layer 110 may have a thickness in a range between about 5 nm and about 500 nm. In an embodiment of FIG. 5, the ILD is made of SiO.

Still referring to FIG. 5, a patterned photoresist (not shown) can be formed over the ILD layer 110 to expose a portion of the ILD layer. The exposed portion of the ILD layer is positioned above the gate structure 104a. The photoresist can be patterned according to any suitable technique, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like. A subsequent etching process, such as a wet etching or a dry etching, can be applied to transfer the patterns defined by the photoresist (not shown) to the ILD layer 110, the CESL layer 114, and the helmet layer 128a. As a result of the etching process, a first contact region 116 is formed. The first contact region 116 is formed in the ILD layer 110, the CESL layer 114, and the helmet layer 128a. The first contact region 116 has side portions and a bottom porting that exposes the gate structure 104a. The etching process may include dry etching (e.g., reactive ion etching (RIE) or inductively coupled plasma (ICP) etching), wet etching, and/or other etching methods. When the etching process is completed, a subsequent plasma ashing and a wet clean can be applied to remove the remaining photoresist.

Figure 6:
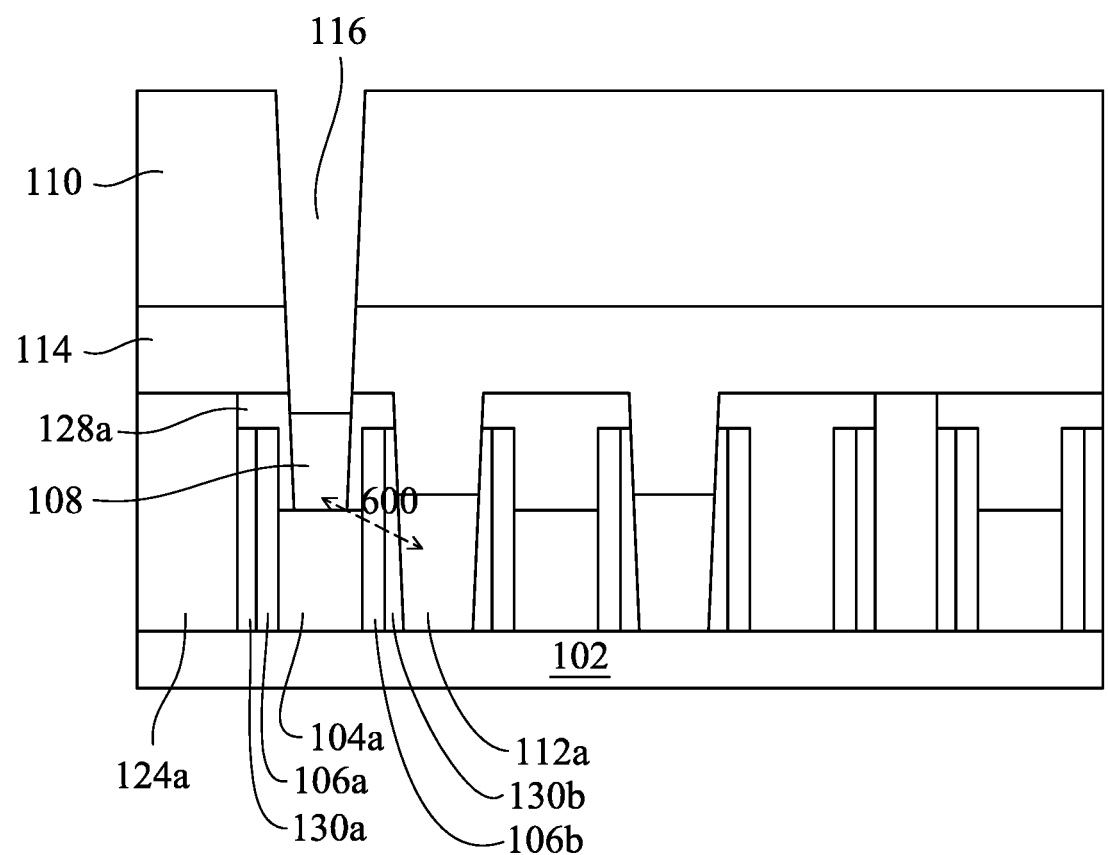

In FIG. 6, the metal cap layer 108 is selectively deposited over the gate structure 104a in the first contact region 116. The selective deposition of the metal cap layer allows the metal cap layer to be preferably formed over the gate structure 104a, and the side portions of the first contact region 116 are not covered by the metal cap layer 108. The metal cap layer 108 can be made of tungsten (W), titanium (Ti), titanium nitride (TiN), combinations thereof, or other suitable conductive materials. The metal cap layer 108 has a thickness in the range from about 2 nm to 100 nm. The metal may be deposited by performing one or more of chemical vapor deposition (CVD), physical vapor deposition (PVD), atomic layer deposition (ALD), sputtering, e-beam evaporation, or any combination thereof. The top surface of the metal cap layer 108 is approximately higher than the top surfaces of the spacer layers 106a-106b and 130a-130b by about 1 nm or more. In an embodiment of FIG. 6, the metal cap layer 108 is tungsten (W). The metal layer 106 may be formed at a temperature between 50° C. and 600° C. and at a pressure of between about 1 Torr and 100 Torr. In one implementation, a precursor such as a halogen-containing tungsten precursor (e.g., WF6) and fluorine free tungsten (FFW) may be used for the selective deposition of the tungsten on the cobalt (Co) and ruthenium (Ru).

Because of the presence of the metal cap layer 108, both the gate structure 104a and the spacer layers 106a-106b and 130a-130b are protected during the subsequent processing steps. Consequently, the gate structure 104a and the spacer layers 106a-106b and 130a-130b are not damaged. Thus, the gate height loss due to the subsequent processing steps is minimized. In addition, an electrical short 600 between the gate structure 104a and the adjacent source/drain electrodes (e.g., 112a) due to the spacer damage is avoided.

Figure 7:
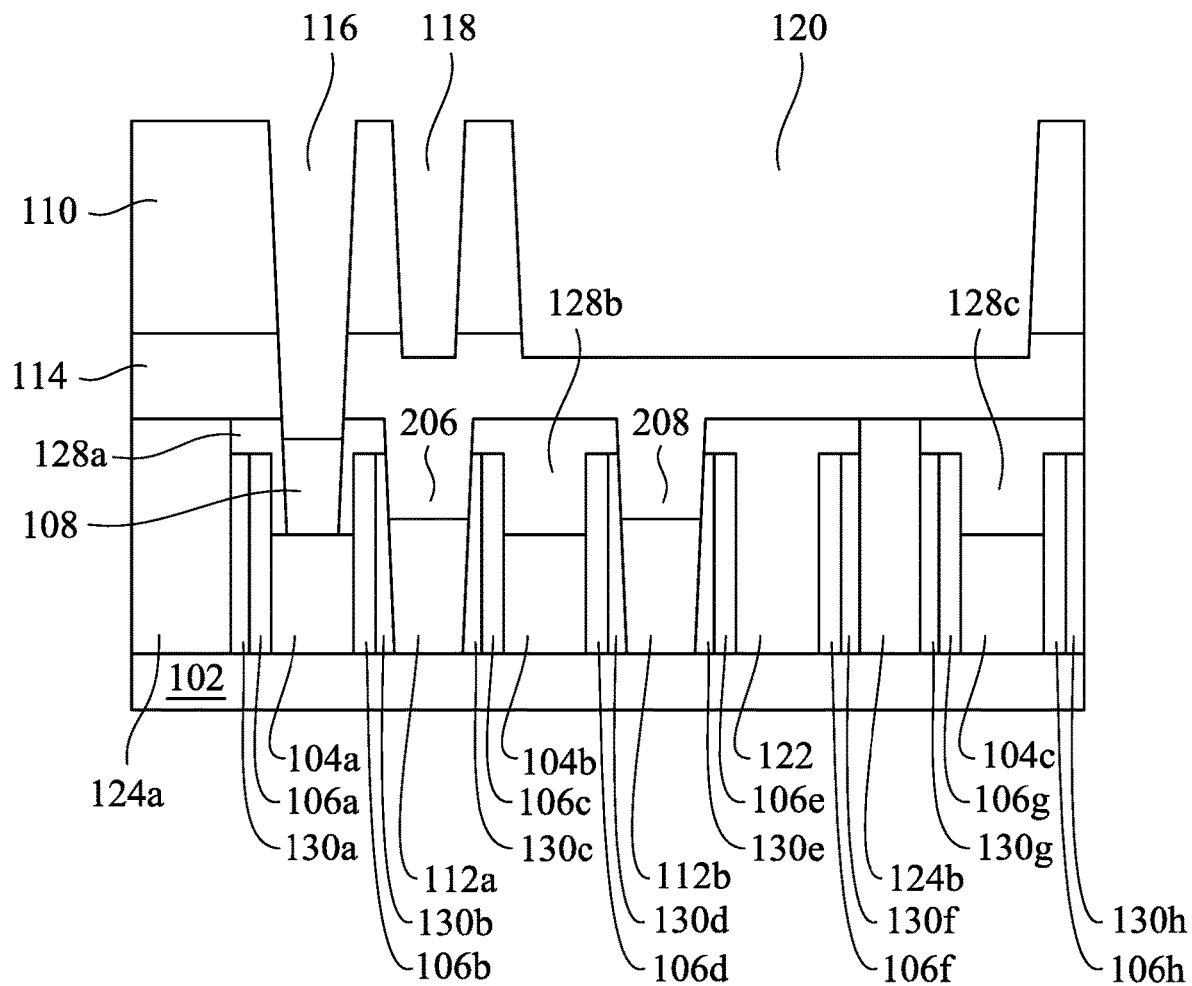

In FIG. 7, a second contact region 118 and a third contact region 120 are formed in the ILD layer 110. The second contact region 118 and the third contact region 120 further extend into the CESL layer 114. The second contact region 118 and the third contact region 120 can be formed by a photolithography patterning process and an etching process, and/or a combination thereof. The photolithography patterning process can form photoresist patterns over the ILD layer 110 based on the design requirements. The photolithography patterning process may include photoresist coating (e.g., spin-on coating), soft baking, mask aligning, exposure, post-exposure baking, developing the photoresist, rinsing, drying (e.g., hard baking), other suitable processes, and/or combinations thereof. The etching process may be performed to transfer the patterns defined by photolithography patterning process to the inter layer dielectric (ILD) layer 110 and CESL layer 114. As a result of the etching process, the contact regions 118 and 120 can be formed. The etching process may include dry etching, wet etching, and/or other etching methods (e.g., reactive ion etching).

Figure 8:
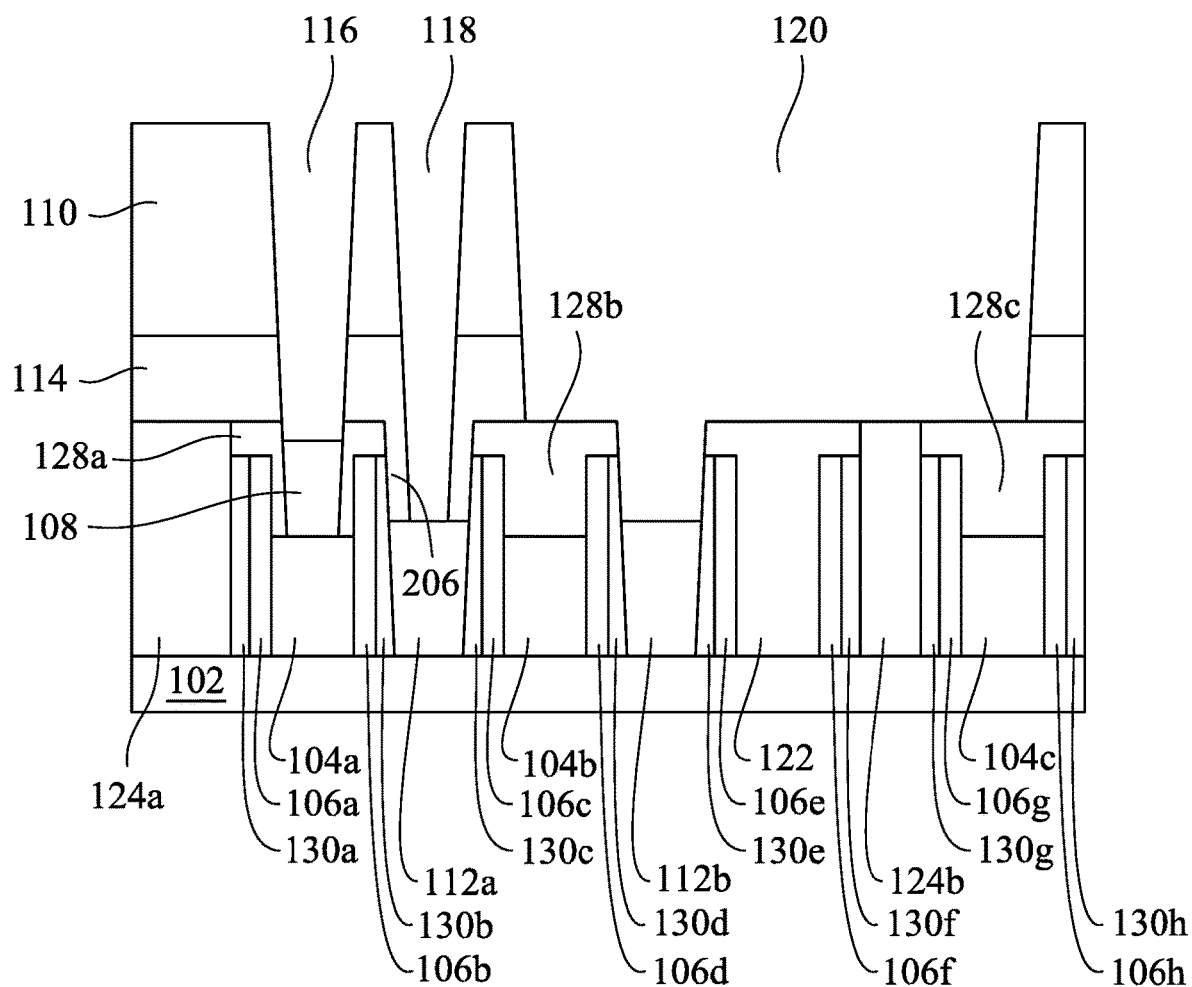

In FIG. 8, a breakthrough (BT) process is performed. The BT process can be performed by performing another etching process, such as a dry etching or a wet etching. As a result of the BT process, the second contact region 118 extends into the CESL 114 and the self-aligned dielectric layer 206. The second contact region 118 has side regions and a bottom region to expose the source electrode 112a. The third contact region 120 also extends into the CESL 114 and the self-aligned dielectric layer 208. The third contact region 120 has side regions and a bottom region to expose the drain electrode 112b. In an embodiment, the self-aligned dielectric layer 208 over the drain electrode 112b in the third contact region 120 can be removed completely depending on technology requirements or etching recipes. In addition, a portion of the CESL layer 114 over the helmet layers 128b/128C, the dummy gate structure 122 and the dummy source/drain electrode 124b can be removed fully. The BT process can be followed by a plasma ashing and a wet clean process to remove the process residue.

Figure 9:
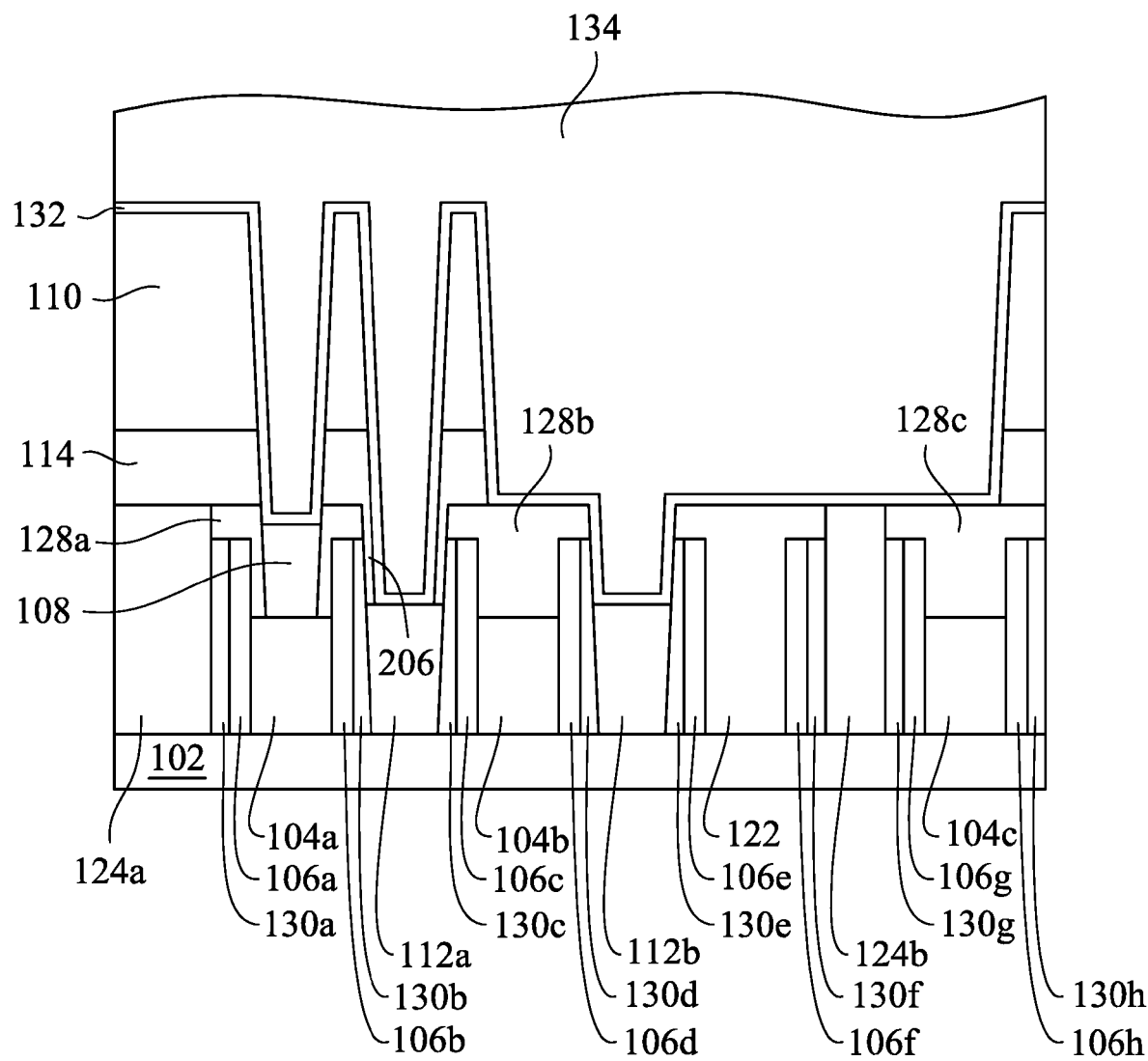

In FIG. 9, a conductive barrier layer 132 is firstly formed over the metal cap layer 108, the source/drain electrodes 112, the helmet layers 128b/128c, the dummy gate structure 122, the dummy source/drain electrode 124b and the ILD layer 110. The barrier layer 132 further covers the side portions of the first contact region 116, the second contact region 118 and the third contact region 120. In some embodiments, the conductive barrier layer 132 can function as both a barrier layer and an adhesion layer to the subsequently formed conductive layer 134, where the conductive barrier layer 132 prevents or reduces the reflow/diffusion of the conductive layer 134 to the surrounding layers (e.g., the ILD layer 110, the CESL layer 114, and the helmet layer 128), and promotes the adhesion of the conductive layer 134 to the surrounding layers. In some embodiments, the conductive barrier layer 132 may be made of Ta, Ti, TiN, TaN, or the like, with a thickness, for example, between 5 Å and 200 Å. The conductive barrier layer 132 can be deposited by performing one or more of chemical vapor deposition (CVD), physical vapor deposition (PVD), atomic layer deposition (ALD), sputtering, e-beam evaporation, or any combination thereof.

The conductive layer 134 is formed over the conductive barrier layer 132 to fill the contact regions 116, 118 and 120. The conductive layer 134 covers the ILD layer 110 when the formation is completed. The conductive layer 134 may include cobalt (Co), tungsten (W), ruthenium (Ru), aluminum (Al), copper (Cu), or other suitable conductors, and be deposited by performing a suitable deposition process, such as chemical vapor deposition (CVD), physical vapor deposition (PVD), atomic layer deposition (ALD), sputtering, e-beam evaporation, or any combination thereof. Alternatively, the conductive layer 134 may include copper (Cu), copper manganese (CuMn), copper aluminum (CuAl), and the like, and an electro-chemical plating (ECP) process may be applied.

Figure 10:
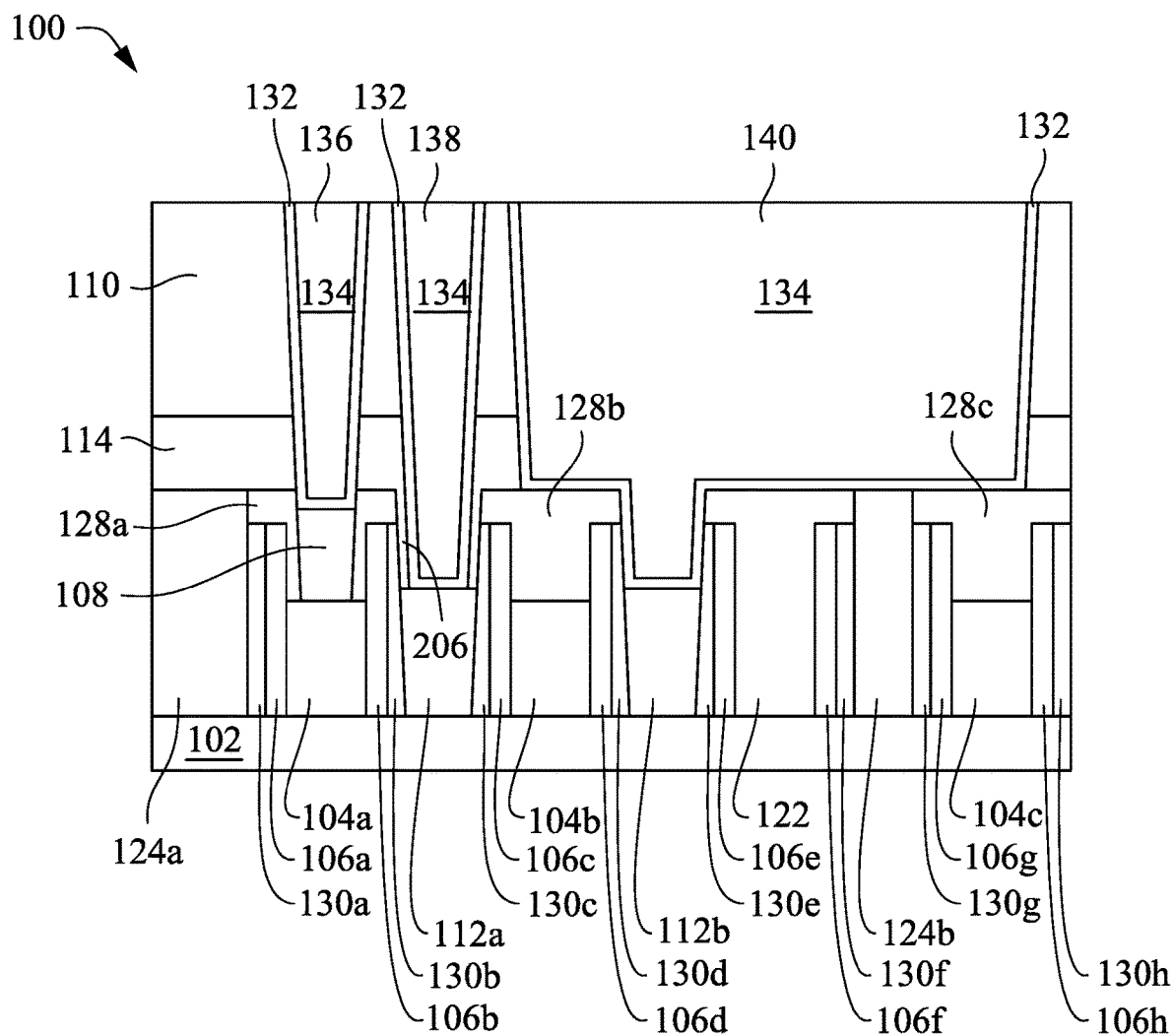

In FIG. 10, the conductive layer 134 and the conductive barrier layer 132 can be recessed to provide a planar topography. A chemical mechanical polishing (CMP) process can be performed to remove any excessive conductive layer 134 and conductive barrier layer 132 over the ILD layer 110. Alternatively, an etching back process may be applied to remove any excessive conductive layer 134 and conductive barrier layer 132 over the ILD layer 110. After the surface planarization, the semiconductor device 100 is formed which is also illustrated in FIG. 1. In the semiconductor device 100, the first contact structure 136 is formed in the first contact region 116 where the conductive layer 134 and the conductive barrier layer 132 are filled in the first contact region 116 and electrically isolated by the surrounding dielectric layers (e.g., the ILD layer, the CESL layer) from the adjacent contact structures (e.g., the second contact structure 138 and the third contact structure 140). The first contact structure 136 passes through the ILD layer 110, the CESL layer 114 and the helmet layer 128a. The first contact structure 136 has side portions and a bottom portions. The bottom portion of the first contact structure 136 is in direct contact with the gate structure 104a. The metal cap layer 108 is formed over the bottom portion of the first contact structure 136 and in direct contact with the gate structure 104a. The conductive barrier layer 132 is formed over the metal cap layer 108 and along the side portions of the first contact structure 136, and the conductive layer 134 is formed over the conductive barrier layer 132 in the first contact structure 136. In some embodiments, the first contact structure 136 is electrically coupled with the gate structure 104a and serves as the gate contact.

The second contact structure 138 is formed in the second contact region 118. The second contact structure 138 passes through the self-aligned dielectric layer 206, the CESL layer 114, and the ILD layer 110. The second contact structure 138 is electrically isolated by the surrounding dielectric layers from the adjacent contact structures. The second contact region 138 has side portions and a bottom portion. The bottom portion is in direct contact with the source electrode 112a. The conductive barrier layer 132 is formed over the source electrode 112a and along the side portions of the second contact structure 138, and the conductive layer 134 is formed over the conductive barrier layer 132 in the second contact structure 138. In some embodiments, the second contact structure 138 is electrically coupled with the source electrode 112a and functions as the source contact.

The third contact structure 140 is formed in the third contact region 120. The third contact structure 140 passes through the self-aligned dielectric layer 208 which is removed during the etching process, the CESL layer 114, and the ILD layer 110. The third contact structure 140 has side portions and a bottom portion. The bottom portion is in direct contact with the drain electrode 112b. The conductive barrier layer 132 is formed over the drain electrode 112b and along the side portions of the third contact structure 140, and the conductive layer 134 is formed over the conductive barrier layer 132 in the third contact structure 140. In some embodiments, the third contact structure 140 is electrically coupled with the drain electrode 112b and is configured to be the drain contact. In addition, the top surfaces of the first contact structure 136, the second contact structure 138, the third contact structure 140 and the ILD layer 110 can be level with.

In further embodiments, the semiconductor device 100 illustrated in FIGS. 2 and 10 can include other components, such as a shallow trench isolation (STI) region, a Fin structure, a source structure, a drain structure, various contacts/vias/lines and multilayers interconnect features, and various dielectric layers. The configuration and component layout of the semiconductor device 100 does not necessary need to be as shown exactly in FIGS. 2 and 10.

Figure 11:
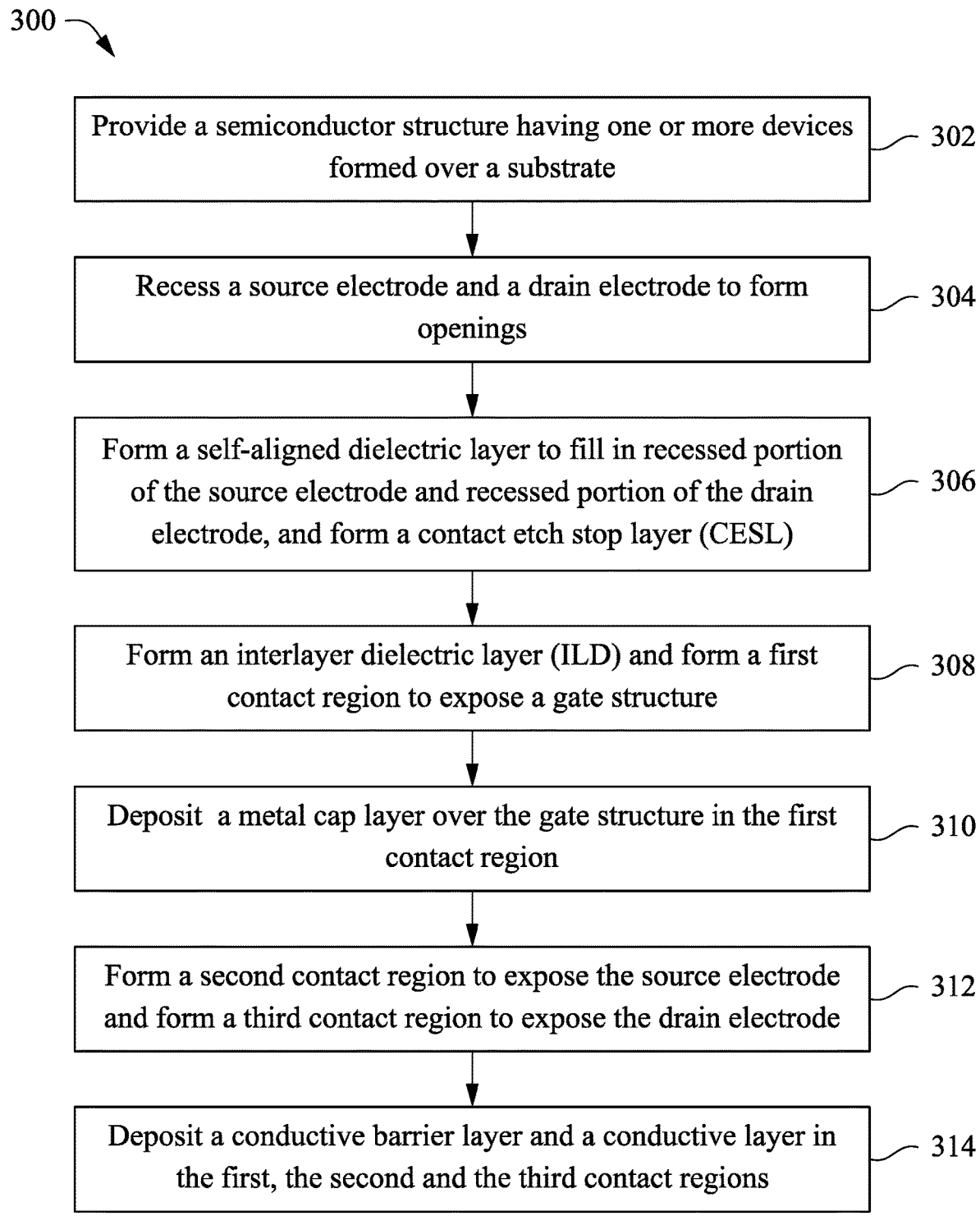
FIG. 11 is a flowchart of a process for manufacturing a semiconductor device in accordance with some embodiments.

FIG. 11 illustrates a flowchart of a process 300 for forming the semiconductor device 100 in accordance with some embodiments. The process 300 begins at 302, where a semiconductor structure including a plurality of gate structures, a plurality of source/drain electrodes, one or more dummy gate structures, and one or more dummy source/drain electrodes is formed. The semiconductor structure can further include spacer layers formed on side portions of the gate structures, the source/drain electrodes, the dummy gate structures and the dummy source/drain electrodes. In addition, a plurality of helmet layers is formed over the gate structures. The semiconductor structure may be substantially similar to the semiconductor structure 200 discussed above with reference to FIG. 2.

The process 300 proceeds to 304, where the source/drain electrodes are recessed by either a dry etching process or a wet etching process. The recessed portion of the source/drain electrodes forms openings (e.g., openings 202 and 204 in FIG. 3). In some embodiment, 304 can be performed as illustrated with reference to FIG. 3.

The process 300 can then proceeds to 306 where a self-aligned dielectric layer is formed in the recessed portion of the source/drain electrodes (e.g., openings 202 and 204). After the self-aligned dielectric layer is formed, a subsequent surface planarization can be operated based on a CMP process. The top surface of the self-aligned dielectric layer is level with the top surfaces of the adjacent helmet layers 128 after the surface planarization is completed. Over the self-aligned dielectric layer and adjacent helmet layers 128, a contact etch stop layer (CESL) is formed. After the formation of the CESL layer, another subsequent surface planarization can be operated through a CMP process. In some embodiment, 306 can be performed as illustrated with reference to FIG. 4.

In another embodiment of implementing 306, the self-aligned dielectric layer and the CESL layer are made of a same material and can be formed in a single processing step. For example, a dielectric material, such as SiN, can be deposited to fill in the recessed portion of the source/drain electrodes (e.g., openings 202 and 204 in FIG. 3). The deposition can be performed further to cover top surfaces of the helmet layers once the recessed portion of the source/drain electrodes is filled fully by the dielectric material SiN. When the deposition is completed, a subsequent surface planarization is operated through a CMP process. When the surface planarization is completed, the dielectric material deposited in the recessed portion of the source/drain electrodes forms the self-aligned dielectric layers (e.g., 206 and 208 in FIG. 4), and the dielectric material deposited over the helmet layers forms the CESL layer (e.g., 114 in FIG. 4).

At 308, an ILD layer is formed over the CESL layer. A subsequent photoresist patterning and an etching process forms the first contact region that have side portions and a bottom portion to expose the gate structure (e.g., 104a in FIG. 5).

The process 300 then proceeds to 310 where a metal cap layer is deposited over the gate structure in the first contact region. The metal cap layer may be deposited by performing a suitable deposition process, such as chemical vapor deposition (CVD), physical vapor deposition (PVD), atomic layer deposition (ALD), or the like. The metal cap layer protects the spacer layers during the subsequent processing steps. In some embodiments, 308 can be performed as illustrated with reference to FIG. 6.

At 312, a second contact region that is electrically coupled with the source electrode and a third contact region that is electrically coupled with the drain electrode is formed. The formation of the second contact region and the third contact region can be formed by at least two steps. In the first step, the second contact region and the third contact region are formed in the ILD layer by photolithography patterning and etching processes, and/or a combination thereof. In the second step, a subsequent breakthrough process is operated to extend the second contact region and the third contact region into the self-aligned dielectric layers. When the breakthrough process is completed, the second contact region extends into the self-aligned dielectric layer and exposes the source electrode. The third contact region also extends into the self-aligned dielectric layer and exposes the drain electrode. In one implementation, the self-aligned dielectric layer (e.g., 208 in FIG. 7) over the drain electrode (e.g., 112b in FIG. 7) in the third contact region can be removed fully by the breakthrough process depending on the design requirements or etching recipes. In some embodiment, 312 can be performed as illustrated with reference to FIGS. 7 and 8.

The process 300 then proceeds to 314, where a conductive barrier layer is formed in the first, the second and the third contact regions. The conductive barrier layer covers the metal cap layer, the source electrode, the drain electrode and the ILD layer. The conductive barrier layer also covers the side portions of the first, the second and the third contact regions. A conductive layer is formed over the conductive barrier layer to fill in the first, the second and the third contact regions. A surface planarization is subsequently operated to remove the excessive conductive barrier layer and excessive conductive layer over the ILD layer. In some embodiments, 314 can be implemented as illustrated with reference to FIGS. 9 and 10. After the surface planarization, a final semiconductor device is formed which is identical to the semiconductor device 100 illustrated in FIG. 1.

In the final semiconductor device, the first contact structure is formed in the first contact region where the conductive layer and the conductive barrier layer are filled in the first contact region and electrically isolated by the surrounding dielectric layers (e.g., the ILD layer, the CESL layer) from the adjacent contact structures (e.g., the second contact structure and the third contact structure). The first contact structure passes through the ILD layer, the CESL layer and the helmet layer. The first contact structure has side portions and a bottom portion. The bottom portion is in direct contact with the gate structure. The metal cap layer is formed over the bottom portion of the first contact structure. The metal cap layer is in direct contact with the gate structure. The conductive barrier layer is formed over the metal cap layer and along the side portions of the first contact structure, and the conductive layer is formed over the conductive barrier layer in the first contact structure. The first contact structure is electrically coupled with the gate structure and serves as the gate contact. The second contact structure is formed in the second contact region. The second contact structure is electrically coupled with the source electrode and functions as the source contact. The third contact structure is formed in the third contact region. The third contact structure is electrically coupled with the drain electrode and is configured to be the drain contact. In addition, the top surfaces of the first contact structure, the second contact structure, the third contact structure and the ILD layer are level with.

It should be noted that additional steps can be provided before, during, and after the process 300, and some of the steps described can be replaced, eliminated, or moved around for additional embodiments of the process 300. In subsequent process steps, various additional interconnect structures (e.g., metallization layers having conductive lines and/or vias) may be formed over the semiconductor device 100. Such interconnect structure electrically connect the semiconductor device 100 with other contact structures and/or active devices to form functional circuits. Additional device features such as passivation layers, input/output structures, and the like may also be formed.

The various embodiments described herein offer several advantages over the existing art. For example, the devices described herein incorporate a metal cap layer over the gate structure having spacer layers formed on the side portions. Because of the presence of the metal cap layer, both the gate structure and the spacer layers are protected during the subsequent etching process and breakthrough process. Consequently, the gate structure and the spacer layers are not damaged. Thus, the gate height loss due to the subsequent etching process and breakthrough process is minimized. In addition, an electrical short between the gate structure and the adjacent source/drain electrodes due to the spacer damage is avoided.

As described above, aspects of the disclosure provides a semiconductor device. The semiconductor device includes a gate structure formed over a substrate. A spacer layer is formed on side portions of the gate structure. A first dielectric layer is formed over the gate structure. In the disclosed semiconductor device, a conductive cap layer passes through the first dielectric layer and is formed over the gate structure. A top surface of the conductive cap layer is above a top surface of the spacer layer. The semiconductor device further includes a conductive layer formed over the conductive cap layer. The conductive layer is electrically coupled with the conductive cap layer.

As described in another aspect of the disclosure, a method for forming a semiconductor device is provided. In the disclosed method, a source electrode and a drain electrode are recessed. The source electrode and the drain electrode are formed over a substrate. A top surface of the source electrode and a top surface of the drain electrode are below a top surface of a first dielectric layer after the source electrode and the drain electrode are recessed. The first dielectric layer is formed over a gate structure and the gate structure is formed over the substrate. In addition, a spacer layer is formed on side portions of the gate structure. A dielectric layer is formed in a recesses portion of the source electrode and a recessed portion of the drain electrode. The dielectric layer further covers the first dielectric layer.

Surface planarization is performed on the dielectric layer. A portion of the dielectric layer formed in the recessed portion of the source electrode and the recessed portion of the drain electrode forms a fourth dielectric layer. A top surface of the fourth dielectric layer is level with the top surface of the first dielectric layer. A portion of the dielectric layer formed over the first dielectric layer forms a second dielectric layer. A third dielectric layers is formed over the second dielectric layer. In the disclosed method, a first contact region is formed and the first contact region passes through the first dielectric layer, the second dielectric layer, and the third dielectric layer. The first contact region has side portions and a bottom portion. The bottom portion of the first contact region exposes the gate structure. A conductive cap layer is formed over the gate structure in the first contact region. A top surface of the conductive cap layer is above a top surface of the spacer layer. A second and a third contact regions are also formed. The second and the third contact regions pass through the fourth dielectric layer, the second dielectric layer and the third dielectric layer. The second contact region has side portions and a bottom portion and exposes the source electrode. The third contact region has side portions and a bottom portion and exposes the drain electrode.

As described in another aspect of the disclosure, a semiconductor device is provided. The semiconductor device includes a metal gate formed over a substrate. A spacer layer is formed on side portions of the metal gate. A top surface of the spacer layer is above a top surface of the metal gate. The semiconductor device also includes a first dielectric layer formed over the metal gate and the spacer layer, a second dielectric layer formed over the first dielectric layer and a third dielectric layer formed over the second dielectric layer. A first contact structure passes through the first dielectric layer, the second dielectric layer and the third dielectric layer. The first contact structure has side portions and a bottom portion. The bottom portion of the first contact region is in direct contact with the metal gate. A metal cap layer is formed over the bottom portion of the first contact structure and is in direct contact with the metal gate. A top surface of the metal cap layer is above a top surface of the space layer. The semiconductor device further includes a conductive barrier layer formed in the first contact structure. The conductive barrier layer is formed over the metal cap layer and along the side portions of the first contact structure. A metal layer is further formed over the conductive barrier layer in the first contact structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate structure formed over a substrate;
   a spacer layer formed on side portions of the gate structure;
   a first dielectric layer formed over the gate structure, the first dielectric layer having a stepped bottom surface having a lower step in contact with a top surface of the gate structure and an upper step in contact with a top surface of the spacer layer;
   a conductive cap layer passing through the first dielectric layer and being formed over the gate structure, a top surface of the conductive cap layer being above the upper step of the stepped bottom surface of the first dielectric layer; and
   a conductive layer formed over the conductive cap layer, the conductive layer being electrically coupled with the conductive cap layer.

2. The semiconductor device of claim 1, further comprising
   a second dielectric layer formed over the first dielectric layer;
   a third dielectric layer formed over the second dielectric layer; and
   a first contact structure passing through the first dielectric layer, the second dielectric layer, and the third dielectric layer, the first contact structure having side portions and a bottom portion, the bottom portion being in direct contact with the gate structure, the conductive cap layer being formed over the bottom portion of the first contact structure, the conductive cap layer being in direct contact with the gate structure, a conductive barrier layer being formed over the conductive cap layer and along the side portions of the first contact structure, and the conductive layer being formed over the conductive barrier layer in the first contact structure.

3. The semiconductor device of claim 2, further comprising:
   a source electrode, a top surface of the source electrode being below a top surface of the first dielectric layer;
   a drain electrode, a top surface of the drain electrode being below the top surface of the first dielectric layer;
   a fourth dielectric layer formed over the source electrode and the drain electrode, a top surface of the fourth dielectric layer being level with the top surface of the first dielectric layer, the second dielectric layer being formed over the fourth dielectric layer and the first dielectric layer, and the third dielectric layer being formed over the second dielectric layer;
   a second contact structure passing through the fourth dielectric layer, the second dielectric layer, and the third dielectric layer, the second contact structure having side portions and a bottom portion, the bottom portion being in direct contact with the source electrode, the conductive barrier layer being formed over the source electrode and along the side portions of the second contact structure, and the conductive layer being formed over the conductive barrier layer in the second contact structure; and
   a third contact structure passing through the fourth dielectric layer, the second dielectric layer, and the third dielectric layer, the third contact structure having side portions and a bottom portion, the bottom portion being in direct contact with the drain electrode, the conductive barrier layer being formed over the drain electrode and along the side portions of the third contact structure, and the conductive layer being formed over the conductive barrier layer in the third contact structure.

4. The semiconductor device of claim 3, wherein the fourth dielectric layer and the second dielectric layer are formed of a same material.

5. The semiconductor device of claim 1, wherein the conductive cap layer comprises tungsten (W), titanium (Ti), or titanium nitride (TiN).

6. The semiconductor device of claim 1, wherein the conductive cap layer has a thickness in a range from 2 nm to 100 nm.

7. The semiconductor device of claim 1, wherein the top surface of the conductive cap layer is above the upper step of the stepped bottom surface of the first dielectric layer by at least 1 nm.

8. The semiconductor device of claim 1, wherein the conductive cap layer is formed of a first material, the conductive layer is formed of a second material, and the first material is different from the second material.

9. The semiconductor device of claim 1, wherein the first dielectric layer is formed over the gate structure and the spacer layer.

10. The semiconductor device of claim 1, further comprising:
   a dummy source electrode, the spacer layer formed on side portions of the dummy source electrode;
   a dummy drain electrode, the spacer layer formed on side portions of the dummy drain electrode; and
   a dummy gate structure, the spacer layer formed on side portions of the dummy gate structure.

11. A semiconductor device, comprising:
   a metal gate formed over a substrate;
   a spacer layer formed on side portions of the metal gate, a top surface of the spacer layer being above a top surface of the metal gate;
   a first dielectric layer formed over the metal gate and the spacer layer;
   a second dielectric layer formed over the first dielectric layer;
   a third dielectric layer formed over the second dielectric layer;
   a first contact structure passing through the first dielectric layer, the second dielectric layer, and the third dielectric layer, the first contact structure having side portions and a bottom portion, and the bottom portion being in direct contact with the metal gate;
   a metal cap layer formed over the bottom portion of the first contact structure, the metal cap layer being in direct contact with the metal gate, and a top surface of the metal cap layer being above an interface formed by the spacer layer and the first dielectric layer and below a top surface of the first dielectric layer;
   a conductive barrier layer formed in the first contact structure, the conductive barrier layer being formed over the metal cap layer and along the side portions of the first contact structure; and
   a metal layer formed over the conductive barrier layer in the first contact structure.

12. The semiconductor device of claim 11, wherein the metal cap layer comprises tungsten (W), titanium (Ti), or titanium nitride (TiN).

13. The semiconductor device of claim 11, wherein the metal cap layer and the metal layer are formed of different materials.

14. The semiconductor device of claim 11, further comprising:
   a source electrode, a top surface of the source electrode being below the top surface of the first dielectric layer;
   a drain electrode, a top surface of the drain electrode being below the top surface of the first dielectric layer;
   a self-aligned dielectric layer formed over the source electrode and the drain electrode, a top surface of the self-aligned dielectric layer being level with the top surface of the first dielectric layer, the second dielectric layer being formed over the self-aligned dielectric layer and the first dielectric layer, and the third dielectric layer being formed over the second dielectric layer;
   a second contact structure passing through the self-aligned dielectric layer, the second dielectric layer, and the third dielectric layer, the second contact structure having side portions and a bottom portion, the bottom portion be in direct contact with the source electrode, the conductive barrier layer being formed over the source electrode and along the side portions of the second contact structure, and the metal layer being formed over the conductive barrier layer in the second contact structure; and
   a third contact structure passing through the self-aligned dielectric layer, the second dielectric layer, and the third dielectric layer, the third contact structure having side portions and a bottom portion, the bottom portion being in direct contact with the drain electrode, the conductive barrier layer being formed over the drain electrode and along the side portions of the third contact structure, and the metal layer being formed over the conductive barrier layer in the third contact structure.

15. A semiconductor device, comprising:
   a metal gate structure over a substrate;
   gate spacers extending from sidewalls of the metal gate structure to past a top surface of the metal gate structure;
   a dielectric helmet capping and in contact with top surfaces of both the metal gate structure and the gate spacers; and
   a metal cap extending vertically in the dielectric helmet to the metal gate structure from a position lower than a topmost surface of the dielectric helmet and higher than topmost surfaces of the gate spacers, wherein the metal cap is laterally spaced from the gate spacers at least in part by the dielectric helmet.

16. The semiconductor device of claim 15, further comprising:
   a source/drain electrode adjacent a first side of the metal gate structure; and
   a dummy source/drain electrode adjacent a second side of the metal gate structure opposite the first side of the metal gate structure, wherein the dummy source/drain electrode has a topmost surface higher than a topmost surface of the source/drain electrode.

17. The semiconductor device of claim 16, wherein the topmost surface of the dummy source/drain electrode is substantially level with the topmost surface of the dielectric helmet.

18. The semiconductor device of claim 16, wherein the topmost surface of the source/drain electrode is higher than a bottommost surface of the metal cap.

19. The semiconductor device of claim 15, further comprising:
   a gate contact extending upwardly from a topmost surface of the metal cap to past the topmost surface of the dielectric helmet.

20. The semiconductor device of claim 15, wherein the dielectric helmet has a stepped bottom surface.

* * * * *